United States Patent [19]

Jacobs

[11] Patent Number: 4,716,388
[45] Date of Patent: Dec. 29, 1987

[54] MULTIPLE OUTPUT ALLPASS SWITCHED CAPACITOR FILTERS

[76] Inventor: Gordon M. Jacobs, 6622 Chabot Rd., Oakland, Calif. 94618

[21] Appl. No.: 685,319

[22] Filed: Dec. 24, 1984

[51] Int. Cl.$^4$ .................... H03H 19/00; H03H 11/12; H03H 11/34
[52] U.S. Cl. ................................. 333/173; 328/151; 328/167; 330/109
[58] Field of Search ...................... 333/173, 167, 172; 364/724, 725, 825; 328/151, 167; 330/9, 109, 110

[56] References Cited

U.S. PATENT DOCUMENTS

| | | | |
|---|---|---|---|
| 4,210,872 | 7/1980 | Gregorian | 330/109 X |
| 4,315,227 | 2/1982 | Fleischer et al. | 333/173 |
| 4,531,106 | 7/1985 | Ganesan | 333/173 |

OTHER PUBLICATIONS

White et al., "A Monolithic Dual-Tone Multifrequency Receiver", Int. Solid State Conference, Digest of Technical Papers, Feb. 1979; pp. 36-37.
McCreary et al.–"All-MOS Charge Redistribution Analog to Digital Conversion Techniques–Part 1", IEEE Journal of Solid-State Circuits, vol. SC-10, Dec. 1975, pp. 371-379.
Martin et al.–"Exact Design of Switched-Capacitor Bandpass Filters Using Coupled-Biquad Structures", IEEE Trans. on Circuits and Systems, Val. SA-27, No. 6, Jun. 1980; pp. 469-475.
Gregorian et al.–"Switched-Capacitor Filter Design Using Cascaded Sections", IEEE Trans. on Circuits and Systems, vol. CAS-27, No. 6, Jun. 1980, pp. 515-522.

*Primary Examiner*—Marvin L. Nussbaum

[57] ABSTRACT

This invention comprises two separate topologies for implementing a second order allpass function filter which is vital for equalization of the phase of other arbitrary response magnitude shaping filters. While the allpass response itself does not affect the frequency spectrum of the signal, these topologies have available outputs that have either bandpass or bandstop characteristics. Thus, two types of useful frequency characteristics formed by the filters that have exactly the same resonant frequency and Q (or Quality factor). Using the well known general two amplifier topology to implement a monolithic switched allpass filter with a high Q leads to very high capacitance ratios and hence excessive silicon area in manufacture. Both the topologies described here reduce the required silicon area by either reducing the required capacitance ratios or making the sensitivity to the smallest capacitor extremely small allowing it to violate otherwise necessary area-to-perimeter matching of the capacitor geometries. Reducing the overall silicon area reduces the overall cost of producing the filters and allows more functionality to be integrated on a single silicon chip.

7 Claims, 7 Drawing Figures

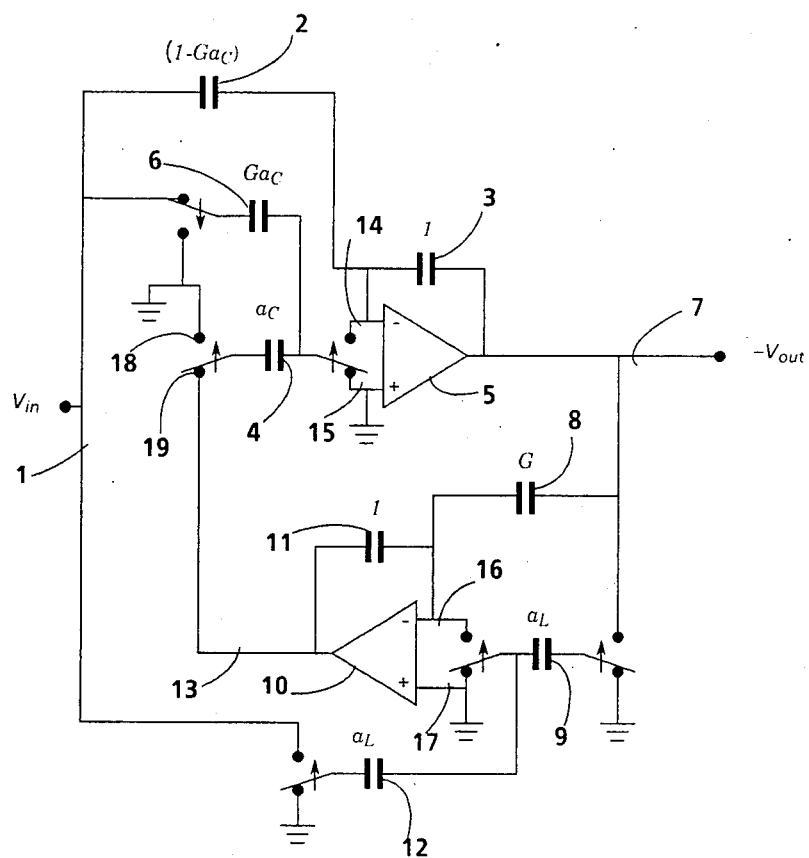
(PRIOR ART)      FIGURE 1a

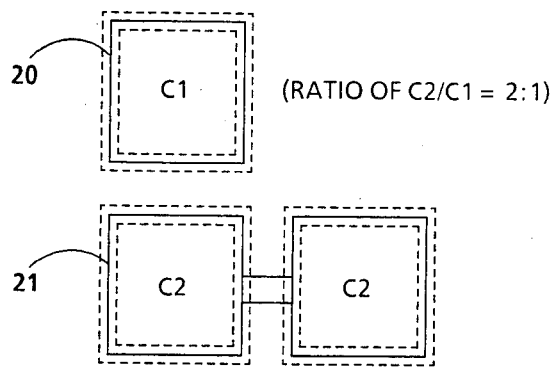
(PRIOR ART) FIGURE 1b

MULTIPLE OUTPUT ALLPASS SWITCHED CAPACITOR FILTERS

TECHNICAL FIELD

This invention relates to electronic filters typically employed in data transmission or communications systems. Biquadratic switched capacitor filters are described that are suitable for implementation on a monolithic silicon integrated circuit chip. The filters use only capacitors, operational amplifiers and switches (formed by MOS transistors) and they are insensitive to parasitic capacitances and processing variations.

BACKGROUND OF THE INVENTION

Switched capacitor filters have made an exciting entry into active filter designs in the past several years by shrinking the size and power required to implement complicated frequency responses. An important part of many communications filter designs involves taking measures to adjust the phase of frequency selective filters to be more linear in nature. This is done so that information at different parts of the passband will reach following circuitry (often a phase sensitive demodulator) at the same time. For narrow bandwidth filters, a number of high Q allpass biquadratic sections are placed at key frequencies to perform the phase equalization. The overall response can be very sensitive to any pole (or zero) location variations in these sections placing great demands on the accuracy of the allpass filter implementation. In monolithic switched capacitor implementations of filters, it is necessary for economical reasons to keep the number of amplifiers in the filter topology and the ratio of the capacitors in the circuit to a minimum. Filters that require huge ratios or many amplifier stages consume too much silicon area to effectively manufacture the chip at a competetive cost.

Employing the generalized two amplifier topology described in the cited references for an allpass filter leads to a capacitor ratio that is "Q" (or Quality Factor) times the integrator capacitor ratios. The sensitivity of the filter characteristics to the capacitors forming this large ratio is such that the capacitor geometries must obey equal area to perimeter matching to maintain accuracy over processing variations.

Two topologies are described in this invention for implementing an allpass biquadratic filter. By making use of a simple summation function (which consumes little overhead area) in the next stage, the largest capacitor ratio in one circuit is reduced to "Q" which matches the ratio requirements of the other filter types when built with the two-amplifier general topology. In the second circuit described, the large ratio exists but it does so only as an artifact of the sampled data domain. Since it only compensates for the effects of switching, and typical clock frequencies employed minimize these effects, the sensitivity to the smallest capacitor used to form the large ratio is very small. This allows the abandoning of area to perimeter matching and the overall silicon area is then the same as a filter with a maximum capacitor ratio of "Q" again.

Additionally, each topology described has a separate output that is not available in the allpass circuits described in prior art. The output exhibits either a bandpass or bandstop characteristic that has the same center frequency and "Q" as the desired allpass filter. This can be extremely useful for other signal processing such as tone detection or rejection.

SUMMARY OF THE INVENTION

A multiple output allpass switched capacitor filter circuit, in accordance with the present invention, comprises a switched capacitor biquadratic filter section whose output port signal is combined with its input port signal by a linear addition circuit to yield a second order allpass response charateristic at the output port of the addition circuit. To obtain an allpass characteristic at the output port of the addition circuit, the biquadratic filter section must itself exhibit either a bandpass or bandstop response characteristic. The term "multiple output" refers to this, since the outputs of the biquadratic section and the addition circuit have identical poles in their transfer functions but different zeros, giving a bandstop or bandpass characteristic at the biquadratic section output and an allpass charactersitic at the adder output port, both centered at the same frequency. These two output characteristics, which track perfectly in frequency can be very useful in certain signal processing applications. Besides having multiple outputs available, there exists further practical advantages in the circuits comprising the present invention over implementing an allpass filter directly from a biquadratic filter section alone. Namely, if the multiple output allpass filter employs a bandstop section, the maximum capacitance ratio in the circuit is reduced over a direct allpass implementation. If the multiple output allpass filter employs a bandpass biquadratic section, the maximum capacitance ratio is the same as a direct allpass implementation, however, the sensitivity of the allpass characteristic to the smallest capacitor in the circuit is greatly reduced. For filters requiring a high "Q", these advantages can reduce the overall size and cost of the filter circuitry. Finally, in a production environment where the frequency of an allpass filter must be adjusted, the multiple output allpass filter allows this to be done by monitoring the amplitude of the signal at the biquadratic section output. Since an allpass filter shows no variation in amplitude as a function of frequency, more expensive phase sensing equipment would be necessary in a direct form implementation of the same filter.

BRIEF DESCRIPTION OF THE DRAWINGS

FIG. 1a shows a prior art implementation of a two-amplifier biquadratic switched capacitor allpass filter.

FIG. 1b illustrates the importance of using equal area of perimeter ratios on capacitor geometries for which the frequency response is sensitive.

FIG. 4b shows a graph of the reduced sensitivity of the smallest capacitor 52 in the circit of FIG. 3. with the same circuit parameters as in FIG. 4a.

FIG. 5 shows a circuit diagram for the implementaion of the summers 37 and 57 shown in FIGS. 2 and 3 to demonstrate the small amount of additional circuitry required over a two-amplifier topology as shown in the prior art circuit of FIG. 1a.

DETAILED DESCRIPTION OF THE PREFERRED EMBODIMENTS

Figure 2:
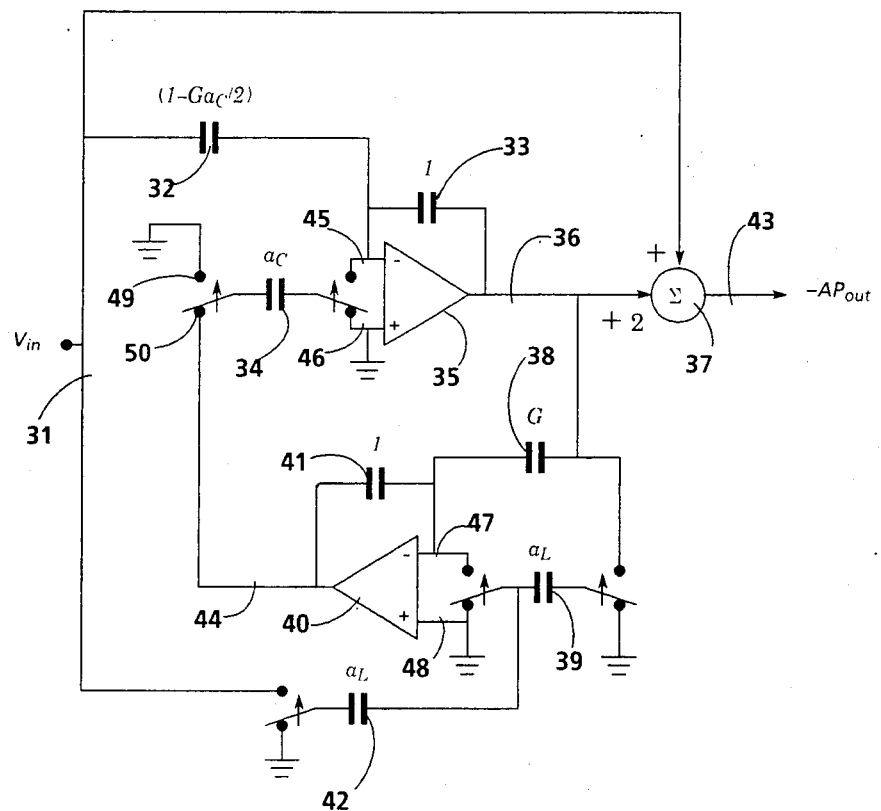
FIG. 2 is a circuit diagram for the first type of allpass filter embodying the principles of the present invention.

Referring to the drawings, FIG. 1a shows a prior art version of the application of the general two-pole filter topology to the allpass function. The switches depicted in the Figures as single-pole, double-throw, break-before-make switches are shown in one of their two possible switched states. All switches are shown in the position relative to other switches in the circuit that gives the correct operation as described by the transfer functions in this section. On an actual integrated circuit, the switches would be formed by MOS transistors operated in synchronism under the control of a two phase timing signal or "clock" (not shown) which causes them to switch between their two switching states at a certain frequency. The timing signals are such that both MOS transistors forming the double-pole switch are in their "off" state before either one is switched into it's "on" state. This accomplishes the break-before-make action. The switches are shown symbolically to simplify the reading of the circuit diagram while discussing topologically important issues. All switches are shown in the state in which they would be during one phase of the two phase clock. See the references listed for a further discussion of the basic switched capacitor principles.

The transfer function of a second order allpass sampled data filter is:

$$H(z) = \frac{(R^2 - 2R\cos\theta z^{-1} + z^{-2})}{(1 - 2R\cos\theta z^{-1} + R^2 z^{-2})} \quad (1)$$

where R is the distance from the origin to the poles and Θ is the angle of the poles to the real axis on the z-plane. The distance from the origin to the zeroes in the filter is simply 1/R as the poles and zeros are reflected about the unit circle. The poles of the circuit of FIG. 1a are formed by a two-integrator loop made up of amplifiers 5 and 10, capacitors 3 and 11 and switched capacitors 4 and 9. The "Q" or quality factor of the poles is determined by capacitor 8. Capacitors connected to switches as described above will herein be referred to as "switched capacitors" and capacitors that are not connected through any switches will herein be referred to as simply "capacitors". Switched capacitors are considered inverting or non-inverting depending upon the way they are connected. When both sides of a switched capacitor are connected to signal ground during the same phase of the two phase clock, then it is inverting. In the circuit diagram of FIG. 1a, switched capacitors 9 and 12 are inverting. When the two sides of a switched capacitor are connected to signal ground on alternating phases of the two phase clock, the switched capacitor is non-inverting. In the circuit diagram of FIG. 1a, switched capacitors 4 and 6 are non-inverting. The pole frequency is determined by the ratio of capacitor 3 to switched capacitor 4 and capacitor 11 to switched capacitor 9. The pole Q is determined by the ratio of capacitors 8 to 1. For typical clocking frequencies where the effects of the switching are minimal (in relation to a continuous time circuit) the capacitor ratios are:

$$a_C \approx a_L \approx 2\pi f_0 / f_c \quad (2)$$

where $f_0$ is the pole frequency and $f_c$ is the clocking frequency of the switches (both in Hertz).

$$G \approx 1/Q \quad (3)$$

The zeroes of the filter are determined by capacitor 2 and switched capacitors 6 and 12. The transfer function of the circuit in FIG. 1a is:

$$\frac{(1 - Ga_C) + (a_C a_L + Ga_C - 2)z^{-1} + z^{-2}}{1 + (a_C a_L + Ga_C - 2)z^{-1} + (1 - Ga_C)z^{-2}} \quad (4)$$

The input signal is applied to lead 1 and the allpass filter characteristic is observed at lead 7. Note that in this prior art circuit for an allpass filter, the switched capacitor 6 must be sized $Ga_C$ or "Q" times smaller than the switched capacitors 4 and 9. Typical clock to center frequency ratios employed set the integrator capacitor to switched capacitor ratios at roughly 10. For an allpass filter with a Q of 10, the largest ratio (capacitor 3 to switched capacitor 6) would have to be 100.

FIG. 1b shows the layout technique for capacitor geometries that is commonly used. Capacitor 21 is sized so that its capacitance will be twice that of capacitor 20. Capacitance is in direct relationship with the area of the capacitor. The solid lines in FIG. 1b are the desired geometries of the capacitors and the dashed lines illustrate the actual final geometries that might occur after processing the integrated circuit. By making the capacitors have an equal ratio of area to perimeter, the first order processing variation on the actual dimensions is cancelled and the desired ratio is achieved. However, the actual shape of the dashed lines representing the edge of capacitors 20 and 21 after processing shows a random variation at close (microscopic) inspection. The minimum capacitor size that is used to form the smallest capacitor in the circuit and the "units" used to make up the larger capacitors is limited by the error caused by the random nature of the edge definition. Given a lower limit on the size of capacitors, a large capacitor ratio means that the required silicon area for the circuit is large if high accuracy is to be maintained. In the prior art circuit of FIG. 1a, the switched capacitors 4, 9, and 12 cannot be made minimum size as is commonly done because the size of switched capacitor 6 must be smaller by a factor Q. This represents a manufacturing problem for this topology allpass filter.

FIG. 2 shows a circuit diagram for an allpass filter that embodies the principles of the current invention. It is understood that the form of the invention herewith shown and described is to be taken as a preferred embodiment. Equivalent elements may be substituted for those illustrated symbolically without departing from the spirit or scope of the invention as defined in the subjoining claims.

The "core" circuit in FIG. 2 is again a two integrator loop formed by amplifiers 35 and 40, capacitors 33 and 41, and switched capacitors 34 and 39. The damping around the loop is formed by capacitor 38. The zeros of the loop are formed by coupling the input signal at lead 31 through capacitor 32 to amplifier 35 and through switched capacitor 42 to amplifier 40. The transfer function observed at lead 36 is:

$$\frac{(1 + 2z^{-1} + z^{-2})\left[\left(1 - \frac{Ga_C}{2}\right) + a_C a_L z^{-1}\right]}{1 + (a_C a_L + Ga_C - 2)z^{-1} + (1 - Ga_C)z^{-2}} \quad (5)$$

The transfer function above exhibits the traditional bandstop characteristic with the same pole frequency and Q as the desired allpass function. Lead 36 is a low impedance output and can be used for other signal processing functions. The desired allpass transfer function described by Equations (1) and (2) is formed by passing the input signal at lead 31 and the bandstop output signal at lead 36 through a summation circuit 37. The summation circuit must weight the signal at lead 36 twice as much as the signal at the input lead 31. The allpass characteristic is then seen at lead 43.

The circuit for the allpass filter defined by the current invention and shown in FIG. 2 has a maximum capacitor ratio of Q for circuits where the Q is higher than the integrator capacitor to switched capacitor ratio as given in Equation (2). This represents a substantial reduction over the maximum ratio required for the prior art circuit of FIG. 1a. High Q filters are often encountered in narrow bandwidth communications systems. In terms of component count, the circuit of FIG. 2 requires one less switched capacitor in the filter structure (capacitor 6 in FIG. 1a is not needed) but it must have an additional summer 37 at the input to the next stage. As will be shown, the components necessary to implement summer 37 do not consume significant silicon area. By reducing the maximum capacitor ratio to a value of Q for higher Q allpass filters and keeping the component count roughly the same as prior art circuit, the ciruit embodied by this invention as shown in FIG. 2 represents a more economical method for implementing allpass filters monolithically.

Figure 3:
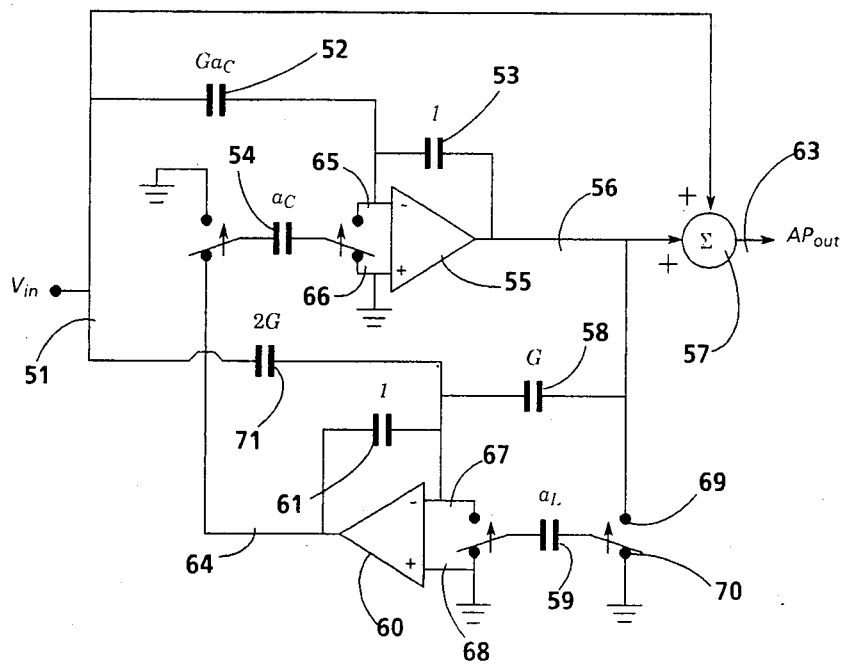
FIG. 3 is a circuit diagram for the second type of allpass filter embodying the principles of the present invention.

FIG. 3 shows a circuit diagram for another allpass filter that embodies the principles of the current invention. This circuit also uses summer 57 to add the input signal at lead 51 with the output of a "core" filter at lead 56. In this case however, the core filter has a bandpass characteristic. The summation circuit 57 must add the signals at leads 56 and 51 with equal weighting in this circuit to get the desired allpass characteristic at the output lead 63. The bandpass filter is formed by the two integrator loop comprised of amplifiers 55 and 60, capacitors 53 and 61, and switched capacitors 54 and 59. As before the damping is formed by capacitor 58. The input lead 51 is fed to the two-integrator loop through capacitors 71 and 52. Lead 56 exhibits a bandpass characteristic with transfer function:

$$-\frac{2Ga_C(1 + z^{-2})}{1 + (a_Ca_L + Ga_C - 2)z^{-1} + (1 - Ga_C)z^{-2}} \quad (6)$$

Figure 4A:
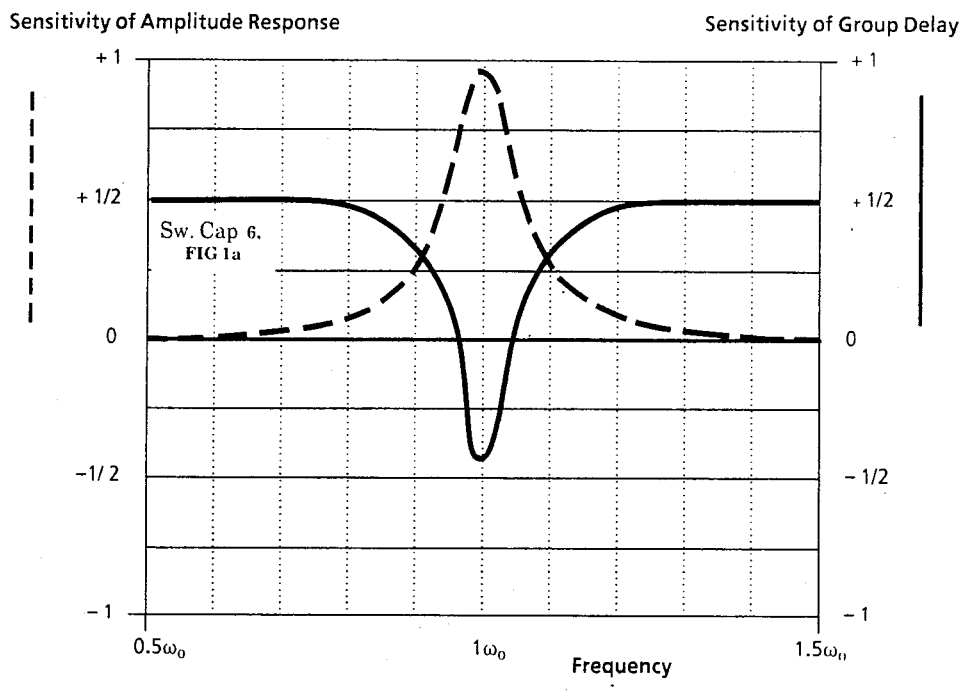
FIG. 4a shows a graph of the sensitivity of the smallest capacitor 6 in the prior art circuit of FIG. 1a. with typical circuit parameters.
Figure 4B:
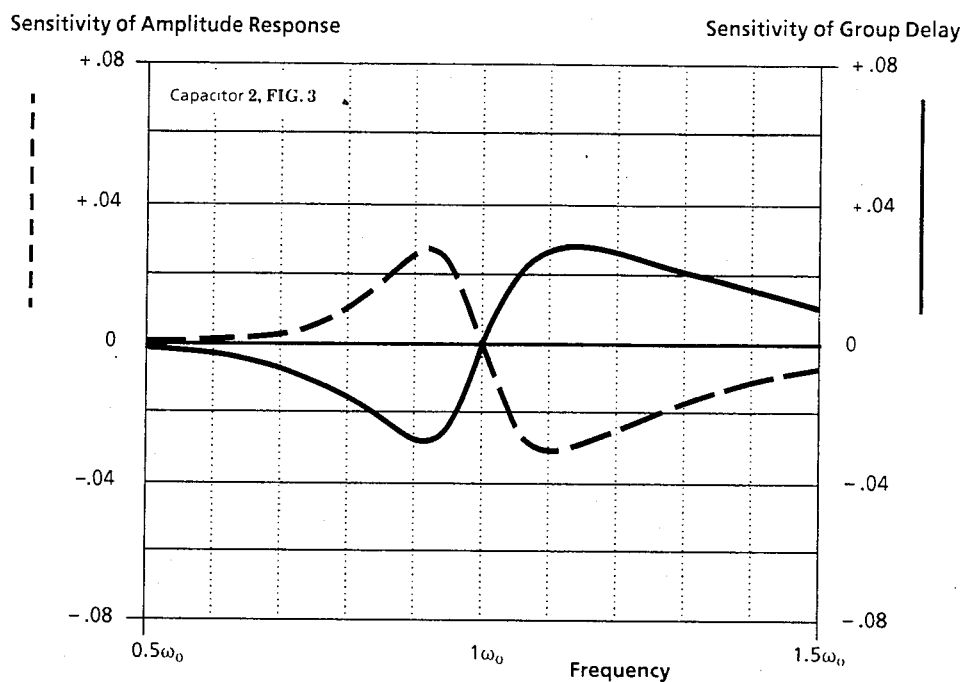

This circuit is attractive because it has the minimum number of switched capacitors. Each switched capacitor in a circuit complicates the layout because the signals must be routed through MOS transistors that require connection to the clocking signals. While the component count is reduced, capacitor 52 has the same large ratio to capacitor 53 as did switched capacitor 6 to capacitor 3 in the prior art circuit of FIG. 1a. While this seems to disqualify the circuit in terms of practicality, it has been found that the sensitivity of the allpass response characteristics to the small capacitor 52 in FIG. 3 is very small for commonly used clock to filter frequency ratios. This can be seen another way. For a traditional active RC implementation of the circuit of FIG. 3, the bandpass filter section would be formed by replacing switched capacitors 54 and 59 by resistors of value $1/f_cC$ where fc is the clocking frequency and C is the size (capacitance) of the switched capacitors. However, the capacitor 52 in FIG. 3 would not be necessary and hence it would be removed. Capacitor 52 exists merely to compensate for a slight phase shift through the bandpass filter that occurrs because of the sampled data nature of the signal transfer. It was this observation that led to the discovery that for commonly used clocking frequencies, the sensitivity of the allpass characteristic to capacitor 52 is extremely small. This is illustrated in FIG. 4 where the sensitivity of the amplitude and group delay response at the output lead of the allpass filter was plotted as a function of frequency. The center is normalized to the center frequency of the filter. FIG. 4a shows the sensitivity of the response at lead 7 to the small switched capacitor 6 in the prior art circuit of FIG. 1a. The graph is read such that a sensitivity of unity means that for a certain percentage change in the component, there will be the same percentage change from the ideal response at the output. FIG. 4b shows the sensitivity of the response at lead 63 to the small capacitor 52 in the circuit embodied by the current invention and shown if FIG. 3. For both graphs, the filter parameters were chosen to be the same. The parameters were:

$$f_c/f_o = 100, \; Q = 8$$

FIG. 4a shows that the sensitivity of the response to capacitor 6 in the prior art circuit is on the order of unity at the center frequency as is typical in a two-integrator circuit. As with the other ratios in the circuit, area to perimeter matching techniques would be necessary to achieve high accuracy in light of processing variations. The sensitivity shown in FIG. 4b on the other hand is very low. Reading the curve in FIG. 4b, it is seen that an error of ten percent in the size of capacitor 52 in FIG. 3 would only cause a response deviation of 0.3 percent (0.03 dB). While the actual error due to processing is dependent on the particular fabrication line, a ten percent variation in the size of capacitor 52 is a typical value when area to perimeter techniques are abandoned. The circuit of FIG. 3 has been observed in a production environment and found to yield acceptable accuracy when area to perimeter matching is abandoned on capacitor 52. Therefore, the circuit of FIG. 3 represents a practical way to implement the allpass filter characteristic with reduced silicon area.

It should be observed also that the traditional RC active filter implementation of the allpass filter shown in FIG. 3 would also have the advantage that it could be tuned easily in a production environment by measuring the bandpass characteristics at lead 56 with an amplitude sensing device. This is usually less expensive and time consuming than using a phase sensing device to tune for the correct response at the allpass output at lead 63. The response at lead 56 could be observed while adjusting components until the correct center frequency and Q are attained.

Figure 5:
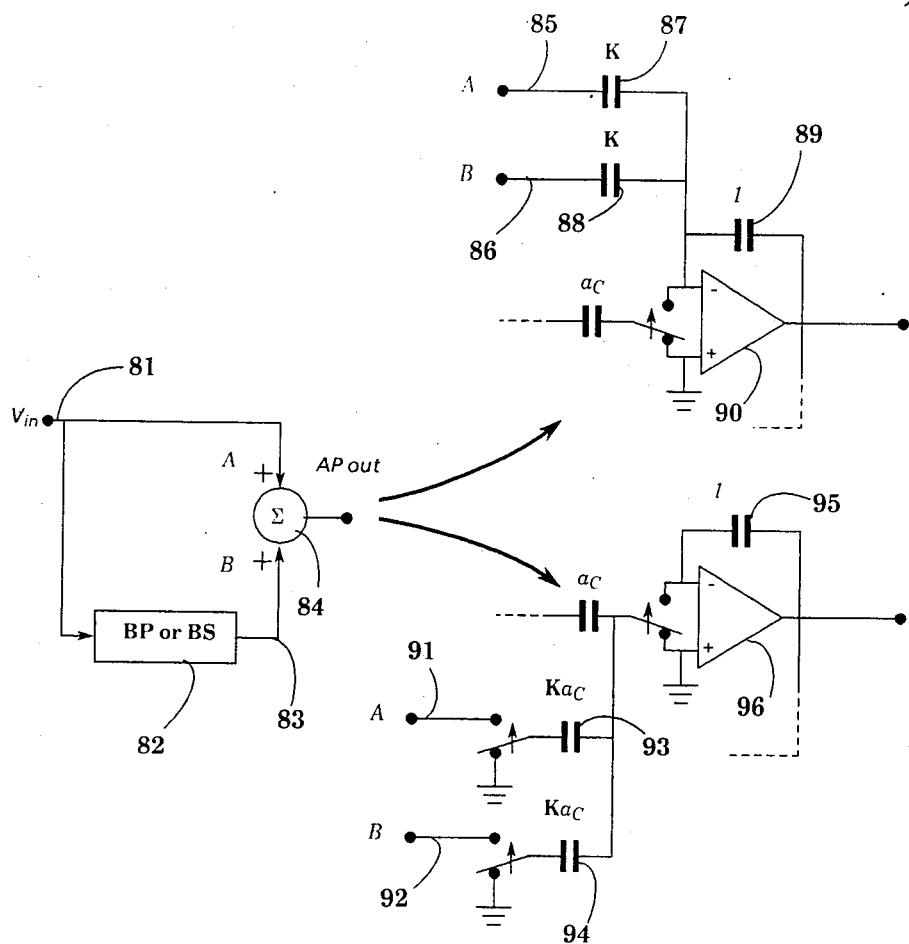

The ideal summation circuits 37 and 57 shown in the circuit diagrams of FIGS. 2 and 3 can easily be implemented at the input to the next stage. This is illustrated in FIG. 5. The input signal at lead 81 and the output lead 83 of the core filter 82 must be added together in summer 84. The way that the summer is formed depends on the type of circuit that follows the allpass section. The upper summer of FIG. 5 is formed by the summing junction of amplifier 90 and the input capacitors 87 and 88. If the allpass section is followed by a highpass section, the the summer would be made in this way. Lead 85 would be connected to lead 81 and lead 86 would be connected to lead 83. The summation can be done by switched capacitors also as shown in the circuit at the bottom of FIG. 5. Here, lead 91 would be connected to lead 81 and lead 92 would be connected to lead 83. This represents the type of summer that would be used if the allpass section were followed by a lowpass section. In the case of a bandstop section, a combination of the two circuits of FIG. 5 is used. Basically, since the input to all other types of filter sections employing two-integrator loops has a summing junction, the summing 84 is made by simply adding one extra input to the next stage, whether it be capacitor or switched capacitor or a combination of both.

I claim:

1. A multiple output allpass biquadratic filter comprising:
   a biquadratic filter section having an input port and an output port and exhibiting either a bandpass or bandstop frequency response characteristic at said output port when a signal is applied to said input port;
   a two input summation circuit whose output port produces the sum of the signals present at its two input ports according to the equation $$V_{out} = aV_1 + bV_2$$

where $V_{out}$ is the signal at the summation circuit output port, $V_1$ is the signal at the summation circuit first input port, $V_2$ is the signal at the summation circuit second input port, and both the constants a and b can be positive or negative but not equal to zero;
   a signal input terminal connected to both the input port of said biquadratic filter section and the first input port of said summation circuit;
   a connection between the output port of the biquadtradic filter section and the second input port of said summation circuit;
   a primary output terminal having an allpass frequency response characteristic that is the output port of the addition circuit;
   a secondary output terminal that is the output port of the biquadratic filter section.

2. A multiple output switched capacitor filter comprising:
   first and second operational amplifiers (55,60), each having an inverting input port (65,67), a non-inverting input port (66,68), and an output port (56,64);
   a capacitor (53) connected between the output port (56) of the first amplifier (55) and the inverting input port (65) of the first amplifer;
   a capacitor (61) connected between the output port (64) of the second amplifier (60) and the inverting input port (67) of the second amplifier;
   a connection between the non-inverting input ports (66,68) of the first and second amplifiers (55,60) and the circuit signal reference node herein referred to as "ground";
   a non-inverting switched capacitor connected between the output port (64) of the second amplifier (60) and the inverting input port (65) of the first amplifier (55), said switched capacitor including
   a capacitor (54) having a first and second plate;
   first switch means for connecting said first plate of said capacitor (54) to said output port (64) of the second amplifier (60) during phase one of a continuous non-overlapping two phase clock generator;
   second switch means for connecting said first plate of said capacitor (54) to ground during phase two of said clock generator;
   third switch meand for connecting said second plate of said capacitor (54) to ground during phase one of said clock generator;
   fourth switch means for connecting said second plate of said capacitor (54) to said input port (65) of the first amplifier (55) during phase two of said clock generator;
   an inverting switched capacitor connected between the output port (56) of the first amplifier (55) and the inverting input port (67) of the second amplifier (60), said switched capacitor including
   a capacitor (59) having a first and second plate;
   fifth switch means for connecting said first plate of said capacitor (59) to ground during phase one of said clock generator;
   sixth switch means for connecting said first plate of said capacitor (59) to said output port (56) of the first amplifier (55) during phase two of said clock generator;
   seventh switch means for connecting said second plate of said capacitor (59) to ground during phase one of said clock generator;
   eighth switch means for connecting said second plate of said capacitor (59) to said input port (67) of the second amplifier (60) during phase two of said clock generator;
   a capacitor (58) connected between the output port (56) of the first amplifier (55) and the inverting input port (67) of the second amplifier (60);
   a capacitor (52) connected between a signal input terminal (51) and the inverting input port (65) of the first amplifier (55);
   a capacitor (71) connected between a signal input terminal (51) and the inverting input port (67) of the second amplifier (60);
   a two input summation circuit (57) whose output port (63) produces the sum of the signals present at its two input ports according to the equation $$V_{out} = aV_1 + bV_2$$

where $V_{out}$ is the signal at the summation circuit output port, $V_1$ is the signal at the summation circuit first input port, $V_2$ is the signal at the summation circuit second input port, and both the constants a and b can be positive or negative but not equal to zero;
   a connection between the input terminal (51) and the first input port of said summation circuit (57);
   a connection between the output port (56) of the first amplifier (55) and the second input port of said summation circuit (57);
   a primary output terminal that is the output port (63) of the summation circuit (57);
   a secondary output terminal that is the output port (56) of the first amplifier (55).

3. The filter in accordance with claim 2 wherein all of said capacitors, switched capacitors, and the constant factors a and b of said summation circuit have preselected values in related ratios to each other in order to provide a filter with pre-determined characteristics at each of its primary and secondary output terminals.

4. The filter in accordance with claim 2 wherein all of said switch means are MOS transistors and all of said capacitors, switched capacitors, and the constant factors a and b of said summation circuit have pre-selected values in related ratios to each other in order to provide a filter with pre-determined allpass characteristics at its primary output terminal (63) and bandpass characteristics at its secondary output terminal (56) where the pole frequency and Q of the bandpass filter characteristics are identical to that of the allpass characteristics.

5. A multiple output switched capacitor filter comprising:

first and second operational amplifiers (35,40), each having an inverting input port (45,47), a non-inverting input port (46,48), and an output port (36,44);

a capacitor (33) connected between the output port (36) of the first amplifier (35) and the inverting input port (45) of the first amplifier;

a capacitor (41) connected between the output port (44) of the second amplifier (40) and the inverting input port (47) of the second amplifier;

a connection between the non-inverting input ports (46,48) of the first and second amplifiers (35,40) and the circuit signal reference node herein referred to as "ground";

a non-inverting switched capacitor connected between the output port (44) of the second amplifier (40) and the inverting input port (45) of the first amplifier (35), said switched capacitor including a capacitor (34) having a first and second plate;

first switch means for connecting said first plate of said capacitor (34) to said output port (44) of the second amplifier (40) during phase one of a continuous non-overlapping two phase clock generator;

second switch means for connecting said first plate of said capacitor (34) to ground during phase two of said clock generator;

third switch means for connecting said second plate of said capacitor (34) to ground during phase one of said clock generator;

fourth switch means for connecting said second plate of said capacitor (34) to said input port (45) of the first amplifier (35) during phase two of said clock generator;

an inverting switched capacitor connected between the output port (36) of the first amplifier (35) and the inverting input port (47) of the second amplifier (40), said switched capacitor including a capacitor (39) having a first and second plate;

fifth switch means for connecting said first plate of said capacitor (39) to ground during phase one of said clock generator;

sixth switch means for connecting said first plate of said capacitor (39) to said output port (36) of the first amplifier (35) during phase two of said clock generator;

seventh switch means for connecting said second plate of said capacitor (39) to ground during phase one of said clock generator;

eighth switch means for connecting said second plate of said capacitor (39) to said input port (47) of the second amplifier (40) during phase two of said clock generator;

a capacitor (38) connected between the output port (36) of the first amplifier (35) and the inverting input port (47) of the second amplifier (40);

a capacitor (32) connected between a signal input terminal (31) and the inverting input port (45) of the first amplifier (35);

an inverting switched capacitor connected between the signal input terminal (31) and the inverting input port (47) of the second amplifier (40), said switched capacitor including a capacitor (42) having a first and second plate;

ninth switch means for connecting said first plate of said capacitor (42) to ground during phase one of said clock generator;

tenth switch means for connecting said first plate of said capacitor (42) to said signal input terminal (31) during phase two of said clock generator;

eleventh switch means for connecting said second plate of said capacitor (42) to ground during phase one of said clock generator, said eleventh switch means being connected between the same circuit nodes as said seventh switch means and therefore optionally combined with said seventh switch means into a single switch means;

twelfth switch means for connecting said second plate of said capacitor (42) to said input port (47) of the second amplifier (40) during phase two of said clock generator said twelfth switch means being connected between the same circuit nodes as said eighth switch means and therefore optionally combined with said eighth switch means into a single switch means;

a two input summation circuit (37) whose output port (43) produces the sum of the signals present at its two input ports according to the equation $$V_{out} = aV_1 + bV_2$$

where $V_{out}$ is the signal at the summation circuit output port, $V_1$ is the signal at the summation circuit first input port, $V_2$ is the signal at the summation circuit second input port, and both the constants a and b can be positive or negative but not equal to zero;

a connection between the input terminal (31) and the first input port of said sumation circuit (37);

a connection between the output port (36) of the first amplifier (35) and the second input port of said summation circuit (37);

a primary output terminal that is the output port (43) of the summation circuit (37);

a secondary output terminal that is the output port (36) of the first amplifier (35).

6. The filter in accordance with claim 5 wherein all of said capacitors, switched capacitors, and the constant factors a and b of said summation circuit have pre-selected values in related ratios to each other in order to provide a filter with pre-determined characteristics at each of its primary and secondary output terminals.

7. The filter in accordance with claim 5 wherein all of said switch means are MOS transistors and all of said capacitors, switched capacitors, and the constant factors a and b of said summation circuit have pre-selected values in related ratios to each other in order to provide a filter with predetermined allpass characteristics at its primary output terminal (43) and bandstop characteristics at its secondary output terminal (36) where the pole frequency and Q of the bandstop filter characteristics are identical to that of the allpass characteristics.

* * * * *